United States Patent [19]

Perzentka, Jr.

[11] Patent Number: 5,011,418

[45] Date of Patent: Apr. 30, 1991

[54] COMPUTER TERMINAL COVER ASSEMBLY

[75] Inventor: Thomas R. Perzentka, Jr., Lisle, Ill.

[73] Assignee: AT&T Bell Laboratories, Murray Hill, N.J.

[21] Appl. No.: 562,508

[22] Filed: Aug. 2, 1990

[51] Int. Cl.⁵ .............................................. H05K 5/00
[52] U.S. Cl. ..................................... 439/135; 361/415
[58] Field of Search ................. 439/61, 135, 136, 142, 439/607, 92; 361/415

[56] References Cited

U.S. PATENT DOCUMENTS

| 4,550,960 | 11/1985 | Asick et al. | 439/61 |
| 4,602,829 | 7/1986 | De Andrea | 361/415 |
| 4,758,928 | 7/1988 | Wierec et al. | 361/415 |
| 4,964,810 | 10/1990 | Malotke et al. | 361/415 |

OTHER PUBLICATIONS

"AT&T 3B2 UNIX ® System V Release 3 Owner/Operator Manual," AT&T, 305-684, Issue 1, Copyright 1989, pp. 7-6 Through 7-12, 8-1 Through 8-12.

*Primary Examiner*—Neil Abrams

*Attorney, Agent, or Firm*—D. A. Marshall

[57] ABSTRACT

A quick release backplane or cover assembly for use with a computer terminal to shield feature card slots of the computer terminal card cage. The assembly comprises a ground strap member releasably secured to the computer terminal card cage with filler members each corresponding with a card slot. Each filler member has one end connected by a severable web to the ground strap and an opposite free end extended outward from the ground strap to cover and shield a corresponding feature card slot. Spring clips affixed to sides of the card cage have spring members corresponding with the filler members for engaging the free end of a corresponding filler member. The spring clips have protuberances each corresponding with a spring member and which are formed to maintain a filler member free end in engagement with a spring member and which are releasable with respect to the filler members for enabling the spring members to exert a force for disengaging the filler member free ends from the card cage thereby enabling the ground strap to be released to remove the backplane assembly from the computer terminal.

11 Claims, 2 Drawing Sheets

COMPUTER TERMINAL COVER ASSEMBLY

TECHNICAL FIELD

The invention relates to a backplane assembly for use with a computer terminal to cover and shield card slots of a computer terminal card cage apparatus.

BACKGROUND AND PROBLEM

Personal computer terminals are equipped with a card cage having a number of slots wherein optional feature cards may be plugged into ones of the slots to increase the operational capability of the computer terminals. For example, a feature card having memory chips installed thereon may be inserted into a slot of a computer terminal card cage to increase the random access memory (RAM) of the computer terminal thereby enabling the computer terminal to run more robust software programs. In another application, a hard disk feature card may be inserted into another card cage slot to increase the storage capability of the computer terminal. In still yet another application, a graphics feature card may be inserted into a card cage slot to improve the graphics operational capability of the computer terminal.

A typical backplane assembly is installed on a computer terminal by securing the backplane assembly to the card cage to shield and cover the card slots of the card cage. To install a feature card, the backplane assembly must be removed from the card cage so that the feature card can be inserted into the appropriate slot of the computer terminal card cage. The backplane assembly must then be reconfigured to remove a filler member portion of the backplane assembly that previously covered and shielded the empty card slot. After reconfiguration, the backplane assembly is again assembled onto computer terminal card cage.

A problem arises in that such backplane assemblies are usually secured by screws to the computer terminal card cage. To install each feature card, the backplane assembly must be removed from the computer terminal by removing each screw that secures the backplane assembly to the computer terminal card cage. After the feature card has been inserted into the appropriate slot, the reconfigured backplane assembly must be reassembled to the card cage by reinstalling each screw to secure the backplane assembly back onto the card cage. The time required to complete this time-consuming installation of the feature card greatly increases the down time and decreases the efficiency in use of the computer terminal.

SOLUTION

The foregoing problem is solved by a quick release backplane assembly for use with a computer terminal card cage having slots for receiving feature cards to increase operational capability of the computer terminal and wherein the backplane assembly covers, shields the card cage slots from electromagnetic interference, and directs air flow about the card cage. The assembly comprises a cover member having a generally rectangular configured ground strap with a tab formed at the bottom edge to engage a corresponding slot located in a base of the card cage and having a structure formed at a top edge for releasably securing the cover member to the computer terminal card cage. A plurality of filler members, each corresponding with a card cage slot, extend from opposite edges of the ground strap adjacent to the top and bottom edges thereof with one end of each filler member secured by a severable web to the ground strap and with each filler member having a free end opposite the end secured to the ground strap. The backplane assembly also has a pair of spring clips each of a generally L-shaped configuration with a base section affixed to one of opposing sides of the card cage. The base section of each spring clip has a plurality of pairs of spring tabs formed along one edge thereof and an upright section formed along the opposite edge of the base section with each pair of spring tabs corresponding with one of the filler members. The upright section of each spring clip is formed into a plurality of separated sections each corresponding with one of the filler members and with each separated section having a pyramidal configured protuberance formed therein to extend outward from the separated section above and between one of a pair of the spring tabs to maintain a free end of a filler member in engagement with the pair of the spring tabs. Each separated section is operable with respect to other separated sections for releasing the free end of one filler member to enable the corresponding one pair of spring tabs to exert a force to disengage the filler member free end from the card cage thereby enabling the ground strap to be released to remove the backplane assembly from the computer terminal.

DETAILED DESCRIPTION

Figure 1:
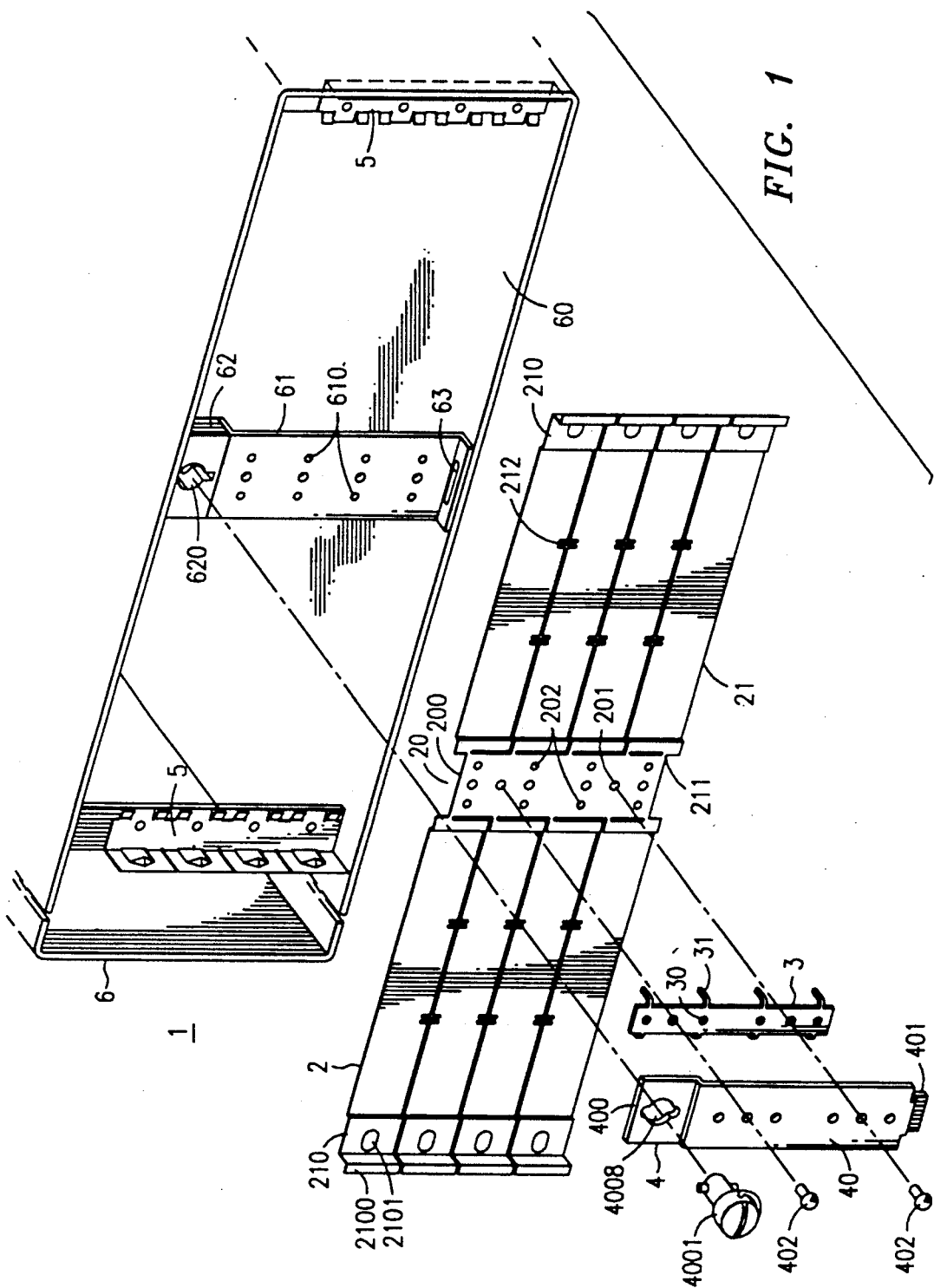
FIG. 1 is an isometric view of a backplane assembly for use in accordance with the principles of the invention to shield and protect feature card slots of a computer terminal.

Computer terminals, such as computer terminal 6, FIG. 1, oftentimes have a card cage which includes a number of slots wherein feature cards may be installed to increase the operational capability of the computer terminal. Computer terminal 6 may, for example, although not limited thereto, be a type of computer terminal referred to as a personal computer. Personal computers are well-known and need not be described in detail for an understanding of the invention. Such computer has apparatus sometimes referred to as a card cage. Feature cards may be installed into the computer card cage simply by inserting a feature card into the slots of the card cage. A feature card may be a circuit board having memory circuitry located thereon that functions when inserted into a computer card cage by increasing the random access memory (RAM) to reconfigure the computer to handle and manipulate larger amounts of data. In another application, a feature card may be a hard disk expansion board that can increase the capability of a computer to store data. Feature cards may also be installed in a computer to increase the graphic enhancement of the computer or to enable the computer to be used to receive and transmit facsimile data. Feature cards may also be used to increase the mathematical and speed capability of the computer.

A computer terminal 6, in one application, FIG. 1, may have a card cage 60 located at the rear of computer terminal 6 or in other versions may have the card cage located at one side, at both sides, or at a side and at the rear, of computer terminal 6. Card cage 60 may have a plurality of slots each with a connector so that a feature card in the form of a circuit board may be inserted into a slot and plugged into a connector associated with the slot which functions to couple the circuitry of the feature card circuit board with the computer terminal circuitry.

One type of card cage 60 may have an upright grounding post 61 located in the center of the backplane of card cage 60 and which is constructed of electrical conducting material and coupled with the grounding circuitry of computer terminal 6. Grounding post 61 may have a generally rectangular configuration with two rows of aligned cavities 610 located therein to enable connections to be made to computer terminal 6 ground. Located at the top of card cage 60, adjacent grounding post 61, is an embossment 62 having an opening or cavity 620 formed to receive the end of a quick release device 4001 and designed such that a turn in one direction of the quick release device 4001 secures device 4001 within cavity 620 and a turn in the opposite direction releases quick release device 4001 from cavity 620.

A quick release backplane assembly 1 is provided for use with computer terminal 6 and particularly for use with card cage 60 to cover and shield the feature card receiving slots of card cage 60 from damage and electromagnetic interference. Backplane assembly 1 comprises a cover member 2 having a generally rectangular configured fastener 4 with a tab 401 formed at the bottom edge thereof which is configured to engage a corresponding slot 63 located in the base of card cage 60. The opposite edge of fastener 4 if formed into structure 400 for use in releasably securing cover member 2 to card cage 60. Structure 400 is formed to have a shaped aperture 4000 adaped to receive and hold quick release device 4001. Quick release device 4001 may be, although not limited thereto, a bolt-like structure having one end configured with a screw head slot or ring that can be used to turn quick release device 4001 in either a clockwise or counter-clockwise direction within aperture 4000. The opposie end of quick release device 4001 may be formed with key-like tabs arranged to be inserted into shaped aperture 4000 to secure quick release device 4001 within fastener strap 4 and cavity 620 to releasably secure cover member 2 to card cage 60.

Locater 3 is a generally rectangular configured member which may be formed of electrically conducting material and is affixed to fastener 4 both to strengthen fastener 4 and to insure that fastener 4 is electrically coupled with ground post 61 of computer terminal 6. A plurality of terminal members 31 are formed along opposing edges of the base portion of locater 3 to extend outward at a right angle with respect to the base portion. The base portion also has a row of apertures 30 formed along the center line thereof for receiving pins 402 used to secure locater 3 between fastener 4 and center section 20 in assembled cover member 2.

Cover member 2 comprises a ground strap formed of fastener 4 and locater 3 secured to center section 20 such that terminal members 31 each engage the sides of and extend through a corresponding aperture 202 of center section 20. Pins 402 are installed in apertures 40 of fastener 4 and extend through corresponding apertures 30 of locater 3 and 201 of center section 20 to secure fastener 4 and locater 3 to center section 20. Center section 20 has sections 200 formed at the top and bottom edges thereof to aid in aligning fastener 4 such that quick release structure 400 and tab 401 extend above and below the top and bottom edges of cover member 2. A plurality of filler members 21, each corresponding with a card cage slot, extend from opposite edges of the ground strap adjacent to top and bottom edges thereof with one end of each filler member secured by a severable web 211 to center section 20 of the ground strap. Free end 210 of each filler member 21 extends outward from the ground strap opposite the end secured by severable web 211 to the ground strap. The free end 210 of each filler member 21 may be formed upward at a right angle and bent over to form segment 2101 which is positioned parallel to the surface of filler member 21 and which is extended by forming a segment upward at a right angle and over to form tab 2100 positioned parallel to both segment 2101 and to the surface of filler member 21. Backplane assembly 1 may be constructed of a reinforced cover member 2 wherein each filler member 21 is connected by a plurality of other severable webs 212 to adjacent filler members 21 leaving each filler member end 210 free to move with respect to free ends 210 of other filler members 21.

Figure 2:
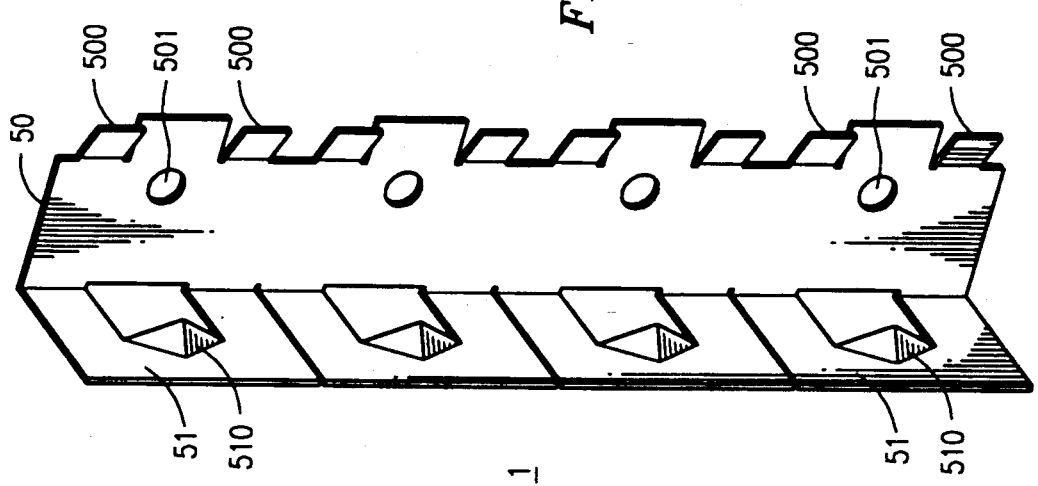
FIG. 2 illustrates one of a pair of spring clips for releasably securing free ends of the cover member filler members set in FIG. 1 to a computer terminal.

Quick release backplane assembly 1 also has a pair of spring clips 5, FIG. 2, each constructed to have a generally L-shaped configuration with a base section 50 affixed by pins or screws inserted through apertures 501 to one of opposing sides of card cage 60, FIG. 1. Base section 50, FIG. 2, is formed with pairs of spring tabs 500 wherein each pair of spring tabs 500 correspond with a filler member 21 and is formed along one edge of base section 50 to extend upward at an angle with respect to the edge thereof. Each spring clip 5 has an upright leg section formed along the opposite edge of base section 50 with the upright leg section having a plurality of separated sections 51 each corresponding with one of filler members 21. Each separated section 51 has a protuberance 510 formed therein to extend outward from separated section 51 above and between one pair of spring tabs 500. A protuberance 510 may be formed, although not limited thereto, in a partial pyramid configuration and functions to maintain a filler member free end 210 in engagement with one pair of spring tabs 500. A separated section 51 is operable with respect to other separated sections 51 for releasing a filler member free end 210 and enabling a corresponding pair of spring tabs 500 to exert a force for disengaging filler member free end 210 from card cage 60.

Figure 3:
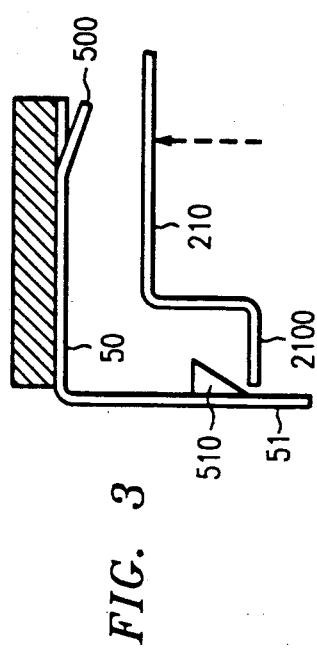
FIGS. 3, 4 and 5 illustrate details in a top view of the use of the spring clip set forth in in FIG. 2 in releasably securing ends of the filler members set forth in FIG. 1 to a computer terminal.
Figure 4:
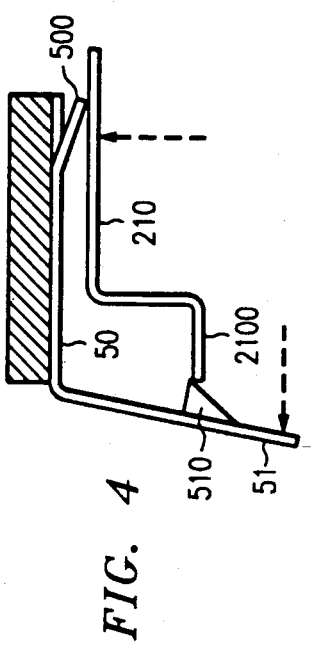
Figure 5:
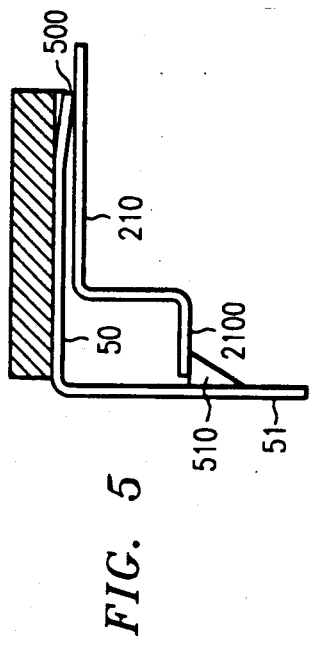

In assembling cover member 2 to computer terminal 6, FIG.1, ground strap tab 401 is inserted into card cage slot 63 and quick release device 4001 is inserted into card cage cavity 620 to releasably secure cover member 2 to computer terminal 6 with terminals 31 of the cover ground strap inserted within apertures 610 of ground post 61. Free ends 210 of filler members 21, FIGS. 3 through 5, are forced downward with respect to spring clips 5 such that segments 2101 engage a corresponding pair of spring tabs 500 and depress the engaged pair of spring tabs 500 downward toward base section 50. The downward force is continued until each filler member free end tab 2100 is positioned beneath protuberance 510 to lock filler member segment 2101 in engagement with depressed spring tabs 500. Thus, cover member 2, FIG. 1, is releasably secured to computer terminal 6 with each filler member 210 extended across one card cage slot to both cover and shield the card cage slot.

In removing cover member 2 from computer terminal 6, FIGS. 3 through 5, separated sections 51 are forced backward to disengage filler member free end tabs 2100 from protuberances 510 thereby enabling each pair of spring end tabs 500 to disengage filler member tabs 2100 from spring clips 5, FIG. 1, and from the opposing sides of card cage 60. Cover member 2 is subsequently removed from computer terminal 6 by turning quick release device 4001 to disengage the device from cavity 620 and removing ground strap tab 401 from card cage slot 63. When cover member 2 has been removed, a feature card can be installed in computer terminal 6 by inserting the feature card into the appropriate card cage slot. The filler member 21 corresponding with the slot in which the feature card was installed may be removed by severing the pertinent severable webs 211 and 212 thereby enabling filler member 21 to be removed from cover member 2. Cover member 2 may be reinstalled on computer terminal 6 as set forth above.

The present embodiment of the invention illustrates that the backplane assembly ground strap is positioned at the center of card cage 60 with filler members 21 extended from each side thereof to shield and protect card slots which are intended to receive horizontal feature cards. Other arrangements are possible within the teaching of the invention. For example, the cover ground strap could be vertically installed at one side of card cage 60 such that filler members 21 would extend from one side of the ground strap to the opposite side of the card cage to be secured by a single spring clip 5 affixed to the opposite side of card cage 60. In another arrangement, the cover ground strap could be horizontally installed across the center of card cage 60 such that filler members 21 would extend upward and downward from ground strap to engage spring clips 5 affixed to top and bottom edges of card cage 60 to cover and shield feature cards that may be installed vertically within card cage 60. In yet other arrangements, the ground strap may be horizontally installed across top or bottom edges of card cage 60 such that filler members 21 would extend downwardly or upwardly to engage a spring clip 5 affixed to the opposite bottom or top edge of card cage 60, respectively. It is also possible within the teaching of the invention to construct spring clip 5 to have a single upright leg 51 with each protuberance 510 corresponding with a single spring tab such that a force applied to the single upright leg 51 would disengage filler member free end tabs 2100 from spring clip 5.

I claim:

1. A backplane assembly for use with a computer terminal card cage having slots for receiving feature cards comprising means for shielding the card cage slots and having a plurality of filler members all with a common end releasably secured to the card cage and with each of said filler members corresponding with one of the card cage slots and having an opposite end extended across the one card cage slot for covering and shielding the one card cage slot, and means affixed to the card cage opposite said filler members common end and having spring members each corresponding with one of said filler members with each spring member formed for engaging said one filler member opposite end and wherein said engaging means have a plurality of protuberances each formed to maintain said one filler member opposite end in engagement with said corresponding spring member and wherein said protubernace is releasable with respect to said one filler member for enabling said corresponding spring member to exert a force for disengaging said one filler member opposite end to extend outward and free from the card cage.

2. The computer terminal backplane assembly set forth in claim 1 wherein said shielding and covering means comprises a cover member having a generally rectangular configured ground strap common to said filler members and wherein a tab is formed at one edge of said ground strap for engaging a corresponding slot of the card cage and wherein a flange is formed at an edge opposite said one edge for detachably securing said cover member to the card cage.

3. The computer terminal backplane assembly set forth in claim 2 wherein said cover member comprises a plurality of generally rectangularly configured filler members each corresponding with a slot of the card cage and each having one end connected by a severable web with said ground strap with an end opposite said one end extended outward from said ground strap and movable with respect thereto.

4. The computer terminal backplane assembly set forth in claim 2 wherein said engaging and enabling means comprises means formed in a generally L-shaped configuration with a base section having a plurality of spring members formed along one edge thereof and an upright section formed along the opposite edge of said base section with said upright section having a plurality of pyramidal configured protuberances each formed to extend outward from said upright section above and to correspond with ones of said spring members for receiving and releasably securing free ends of said filler members to said spring members.

5. The computer terminal backplane assembly set forth in claim 1 wherein said shielding and covering means comprises a cover member having a generally rectangular configured ground strap with a tab formed at a bottom edge for engaging a corresponding slot located in a base of the card cage and having a structure formed at a top edge for releasably securing said cover member to the card cage and wherein said ground strap has a plurality of filler members each corresponding with a card cage slot and extending from opposite edges of the ground strap adjacent to said top and bottom edges with one end of each filler member secured by severable web to said ground strap and having a free end opposite said secured end for engaging a corresponding one of said spring members.

6. The computer terminal backplane assembly set forth in claim 5 wherein said engaging and enabling means comprises A pair of spring clips each of a generally L-shaped configuration with a base section affixed to one of opposing sides of the card cage with said base section having a plurality of pairs of spring tabs formed along one edge thereof and an upright section formed along the opposite edge of said base section with said upright section having a plurality of pyramidal configured protuberances each formed to extend outward from said upright section above and to correspond with a pair of said spring tabs to maintain a free end of one of said one filler members in engagement with said one pair of spring tabs and releasable with respect to said one filler member for enabling said one pair of spring tabs to exert a force for disengaging said one filler member free end from the card cage.

7. The computer terminal backplane assembly set forth in claim 6 wherein each spring clip upright section comprises a plurality of separated sections each corresponding with one of said filler members and each of said separated sections having one of said protuberances formed therein to extend outward from said separated section above and between one of a pair of said spring tabs to maintain a free end of one of said one filler members in engagement with said one pair of spring tabs and each separated section operable with respect to other separated sections for releasing said one filler member free end and enabling said one pair of spring tabs to exert a force for disengaging said one filler member free end from the card cage.

8. The computer terminal backplane assembly set forth in claim 1 wherein said shielding and covering means comprises a cover member having a generally rectangular configured ground strap with a tab formed at a bottom edge for engaging a corresponding slot located in a base of the card cage and having a structure formed at a top edge for releasably securing said cover member to the card cage and wherein said ground strap has a plurality of filler members each corresponding with a card cage slot and extending from one edge of the ground strap adjacent to said top and bottom edges with one end of each filler member secured by a severable web to said ground strap one edge and having a free end opposite said secured end extending across one card cage slot for covering and shielding the one card cage slot.

9. The computer terminal backplane terminal set forth in claim 8 wherein said engaging and enabling means comprises a spring clip of a generally L-shaped configuration affixed to a side of the card cage opposite said ground strap and having a base section with a plurality of pairs of spring tabs formed along one edge thereof and a plurality of upright separable sections formed along the opposite edge of said base section with each upright separable section having a protuberance formed to extend outward from said upright separable section above and between one pair of said spring tabs to maintain an opposite end of one of said one filler members in engagement with said one pair of spring tabs and releasable with respect to said one filler member for enabling said one pair of spring tabs to exert a force for disengaging said one filler member opposite end from the spring clip.

10. A quick release backplane assembly for use with a computer terminal card cage having slots for receiving feature cards to increase operational capability of the computer terminal comprising a cover member having a generally rectangular configured ground strap with a tab formed at the bottom edge to engage a corresponding slot located in a base of the card cage and having a structure formed at a top edge for releasably securing said cover member to the card cage, a plurality of filler members each corresponding with a card cage slot and extending from opposite edges of the ground strap adjacent to said top and bottom edges thereof with one end of each filler member secured by a severable web to said ground strap and having a free end opposite said secured end, a pair of spring clips each of a generally L-shaped configuration with a base section affixed to one of opposing sides of the card cage with said base section having a plurality of pairs of spring tabs formed along one edge thereof and an upright section formed along the opposite edge of said base section with said upright section having a plurality of separated sections each corresponding with one of said filler members and each of said separated sections having a protuberance formed therein to extend outward from said separated section above and between one of a pair of said spring tables to maintain a filler member free end in engagement with said one pair of spring tabs and each separated section operable with respect to other separated sections for releasing said one filler member free end and enabling said one pair of spring tabs to exert a force for disengaging said one filler member free end from the card cage.

11. The quick release backplane assembly set forth in claim 10 wherein the backplane assembly comprises a reinforced cover member wherein each filler member is connected by a plurality of other severable webs to adjacent ones of said filler members leaving each filler member free end free to move with respect to said free ends of other said filler members.

* * * * *